United States Patent [19]
Sakoh

[11] Patent Number: 5,824,591
[45] Date of Patent: Oct. 20, 1998

[54] METHOD FOR MANUFACTURING A STACKED CAPACITOR

[75] Inventor: Takashi Sakoh, Tokyo, Japan

[73] Assignee: NEC Corporation, Tokyo, Japan

[21] Appl. No.: 805,972

[22] Filed: Feb. 26, 1997

[30] Foreign Application Priority Data

Feb. 29, 1996 [JP] Japan .................................. 8-043311

[51] Int. Cl.$^6$ .................................................. H01L 21/20
[52] U.S. Cl. ........................ 438/396; 438/253; 438/256; 438/399
[58] Field of Search .................................. 438/253, 254, 438/255, 256, 396, 397, 398, 399; 148/DIG. 14

[56] References Cited

U.S. PATENT DOCUMENTS

| | | | |
|---|---|---|---|
| 5,488,011 | 1/1996 | Figura et al. | 438/396 |
| 5,508,222 | 4/1996 | Sakao | 438/396 |

FOREIGN PATENT DOCUMENTS 6-29463  2/1994  Japan .

*Primary Examiner*—Tuan H. Nguyen
*Attorney, Agent, or Firm*—Sughrue, Mion, Zinn, Macpeak & Seas, PLLC

[57] ABSTRACT

There is provided a semiconductor device and a method for manufacturing the same wherein a capacitor stack is not separated from a substrate even when a shift in setting occurs between a contact and a stack pattern, and even when the stack pattern has a small size. After a contact hole is opened in an interlayer insulating film, a first polysilicon film which constitutes a storage electrode and a first BPSG film which constitutes a core are formed, one after another. Then a stack pattern is formed by patterning the first BPSG film and the first polysilicon film. A second polysilicon film is formed on a side wall of the stack pattern. Next, a second insulating BPSG film is formed on the overall surface of the silicon substrate, so that the upper surface of the second insulating film is located at a position higher than the upper surface of the stack pattern. After that, the second BPSG film is etched and removed until the upper surface of the first BPSG film of the core is exposed. Then the second BPSG film is etched until the BPSG film of the core is completely removed.

16 Claims, 15 Drawing Sheets

METHOD FOR MANUFACTURING A STACKED CAPACITOR

BACKGROUND OF THE INVENTION

1. Field of the Invention

The present invention relates to a semiconductor device and a manufacturing method of the same, and more particularly to a semiconductor memory device such as a DRAM or the like which has adopted a cylinder type capacitor and a manufacturing method of the same.

2. Description of the Related Art

In recent years, as DRAM's (Dynamic Random Access Memories) are integrated more and more to a higher level, a size of cells tends to be reduced. However, to improve endurance against a soft error, the capacitor must secure a certain size of an area. Consequently, it is indispensable to adopt cells such as stacked capacitor cells, trenched capacitor cells or the like which have a three-dimensional structure. Then, as stacked capacitor cells in which cells are stacked on a semiconductor substrate, various types are further proposed such as a conventional type, a cylinder type, a fin type and the like.

Here, an explanation will be made on a method for forming a general cylinder type capacitor.

In the beginning, after a diffusion layer region 2, a field oxide film 3 (device separation oxide film), a bit line 4 and an interlayer insulating film 5 are formed on a silicon substrate, as shown in FIG. 1 (a), an etch-stop film 6 is formed which constitutes a stopper at the time of removing a core of the cylinder. Here, an BPSG film is generally used as the interlayer insulating film 5. Next, as shown in FIG. 1(b), in an interlayer insulating film 5, a contact hole 7 is opened which reaches the diffusion layer region 2. After that, as shown in FIG. 1 (c), a polysilicon film 8 and a BPSG film 9 which constitutes a core of a cylinder are formed on an overall surface of the silicon substrate 1.

Then, as shown in FIG. 1(d), the polysilicon film 8 and the BPSG film 9 are allowed to remain on a storage electrode formation region by patterning the polysilicon film 8 and the BPSG film 9 using a photoresist film 10 as a mask. (A stacked film formed at this step is referred to as a stack pattern). Next, the photoresist film 10 is removed and the polysilicon film is formed again on the overall surface thereof followed by etching back the silicon substrate with the result that the polysilicon film 12 is allowed to remain only on a side wall of the stack pattern 11 as shown in FIG. 1 (e). In this manner, the stack pattern 11 is set in a state in which the core formed of the BPSG film is embedded inside of an outside wall formed of polysilicon. Next, BPSG film 9 is etched by the etching technique having a high selectivity removed with respect to etch-stop film 6, and the stack pattern 11 is formed into a cylindrical structure in which a core is removed as shown in FIG. 1 (f) thereby completing a storage electrode 13.

After that, a capacitor structure can be obtained by forming a dielectric film and a upper electrode one after another. A method for forming this type of cylinder capacitor is disclosed in Japanese Patent Laid Open No. 29463/94. Then, in the Patent Laid Open, an example is shown which uses a silicon nitride film as a material for an etch-stop film. It is general to use buffered fluoric acid (BHF) for removing the core BPSG film at that time. Additionally, there is also available a technique wherein a silicon oxide vapor is used as an etch-stop material, and a gas phase HF is used for selectively removing the core BPSG film (1992 IEDM TECHNICAL DIGEST pp. 259–262).

Here, a current photolithography technique will be considered. The photolithography technique comes almost to a limit because of a limit in a miniaturization of devices and a limit of higher integration thereof. For example, a setting precision at 3 σ of an exposing device is set to about ±0.07 μm, while a setting margin of 256M DRAM's which are manufactured by using a minimum design rule at 0.25 μm is set to about 0.05 μm. In addition, there is also seen a phenomenon in which the patterns will be smaller at an end part of a sub-array because of a problem of the structure. As a consequence, a shift in the setting of the patterns is generated and the patterns will get smaller than a desired size in many cases.

By the way, in the aforementioned conventional method for forming the cylinder capacitor, a process using the stopper utilizes high etching selectivity technique between the BPSG film which constitutes the core of the cylinder and the silicon nitride film or the silicon oxide film which constitutes the stopper. However, as described above, because of the limit of the photolithography technique, a shift in the forming of the resist pattern at the time of the formation of the stack patterns with respect to the contact hole is generated. On the other hand, when the stack formation is etched in a state in which the resist pattern is small in size, a slit 14 shown in FIG. 1(g) is generated and the BPSG film of the interlayer insulating film 5 is exposed. Furthermore, when the BPSG film is etched to remove the core in this state, an etching liquid is permeated into the slit 14 with the result that a gap 15 shown in FIG. 1(h) is generated and the BPSG film of the interlayer insulating film 5 is largely regressed. Then when the process such as the cleaning or the like in this state is passed through in this state, there arises a grave problem in that the stack pattern is lifted off because of a weakened close contact with the base with the result that the part ceases to function as the capacitor.

The present invention has been made in order to solve the aforementioned problem, and an object of the invention is to provide a semiconductor device in which the stack pattern is not separated, even when the contact and the stack pattern generates a shift in the setting and even when the size of the stack is small, as well as a method for manufacturing the same semiconductor device.

SUMMARY OF THE INVENTION

In order to attain the aforementioned object, the present invention provides a semiconductor device having a capacitor in which a storage electrode, a dielectric film, and an upper electrode are stacked on an interlayer insulating film, characterized by comprising:

an insulating film which is formed around the storage electrode on the interlayer insulating film; and an upper surface of the insulating film being located at a position lower than the uppermost part of the storage electrode, and at a position higher than a lower surface of the storage electrode. Then, as the aforementioned insulating film, any of the silicon nitride film, the silicon oxide film or the BPSG film can be used.

Furthermore, the present invention provides a method for manufacturing a semiconductor device having a capacitor stacked on an interlayer insulating film and an cylindrical structure in which a storage electrode of the capacitor, the method comprising the steps of:

a) forming an interlayer insulating film on a semiconductor silicon substrate followed by having a conductive layer followed by opening on the interlayer insulating film a contact hole which reaches the conductive layer;

b) forming a first conductive film which constitutes a storage electrode on an overall surface of the silicon substrate which extends over the interlayer insulating film and the inside of the contact hole;

c) forming a first insulating film on an overall surface of the silicon substrate;

d) patterning the silicon substrate so that the first insulating film and the first conductive film are allowed to remain on a storage electrode formation region;

e) forming a second conductive film on the first insulating film and on the side wall of the first conductive film which have been patterned;

f) forming the second insulating film on the overall surface of the silicon substrate so that the upper surface of the second insulating film is located at a position higher than the upper surface of the first insulating film;

g) removing the second insulating film until the upper surface of the first insulating film is exposed; and h) etching back of the first insulating film and the second insulating film under high selectivity etching condition with respect to the first conductive film and the second conductive film until the first insulating film is removed.

Furthermore, as described above, a first conductive film which constitutes the storage electrode is formed on the overall surface of the silicon substrate. At the same time, after the first conductive film is selectively formed in the contact hole in the beginning instead of filling the inside of the contact hole with the first conductive film, the second conductive film which constitutes the storage electrode may be formed on the overall surface of the silicon substrate. Otherwise, after the stopper insulating film is formed on the interlayer insulating film in the beginning, the contact hole is opened, the first conductive film which constitutes the storage electrode is formed on the overall surface of the silicon substrate, and, at the same time, the inside of the contact hole may be embedded with the first conductive film.

According to the present invention, even when a shift in the setting is done between the contact hole pattern and the patterns of the first insulating film and the first conductive film in the process of photolithography, or even when a slit is formed in the interlayer insulating film because the patterns of the first insulating film and the first conductive film are small, the slit is filling with the second insulating film after. At the same time, since the first insulating film which constitutes the core of the cylinder is thicker than the second insulating film, the interlayer insulating film is not exposed and never etched at the time of the removal of the first insulating film, namely, the remove of the core of the cylinder.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

A first embodiment according to the present invention will be explained by referring to FIGS. 2(a) through 2(h). FIGS. 2(a) through 2(h) are process flow views showing a method for manufacturing a semiconductor device according to the first embodiment in an order of steps. Incidentally, in all the drawings used in the following embodiments, only the part of the cylinder capacitor which is a characteristic of the present invention will be shown. An illustration and explanation of other parts such as a gate electrode and the like which naturally exist in the semiconductor device will be omitted.

Figure 1A:
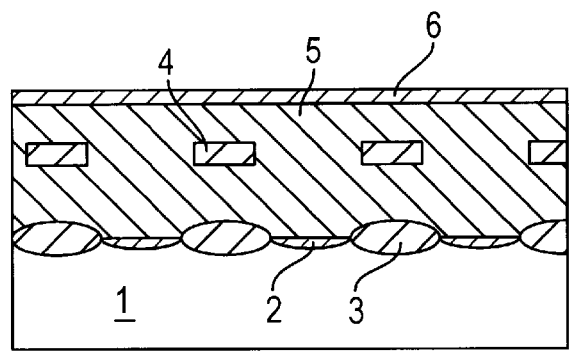
FIGS. 1(a) through 1(f) are process flow views showing a method for manufacturing a conventional semiconductor device having a cylinder type capacitor in an order of steps in the method.
Figure 1B:
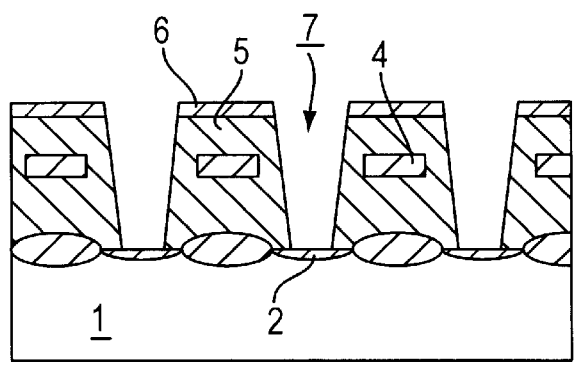
Figure 1C:
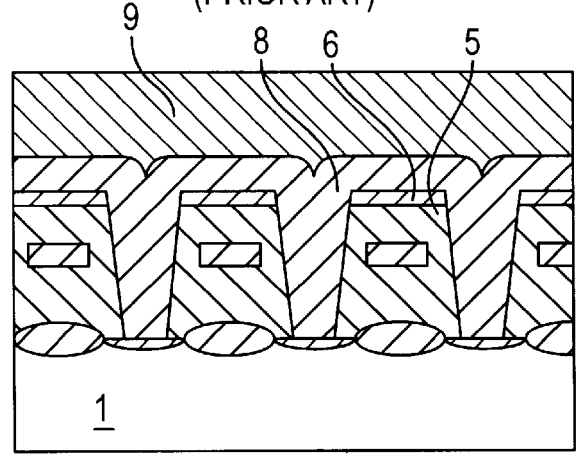
Figure 1D:
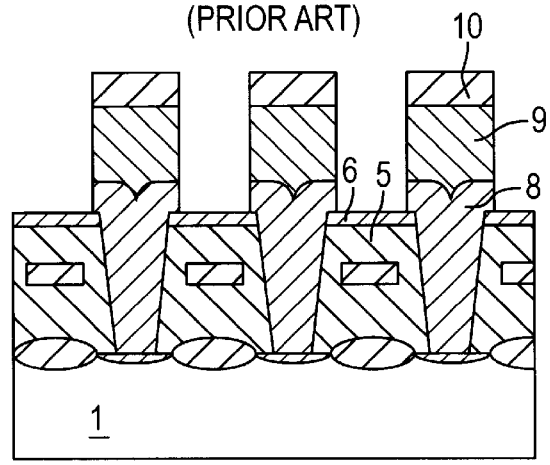
Figure 1E:
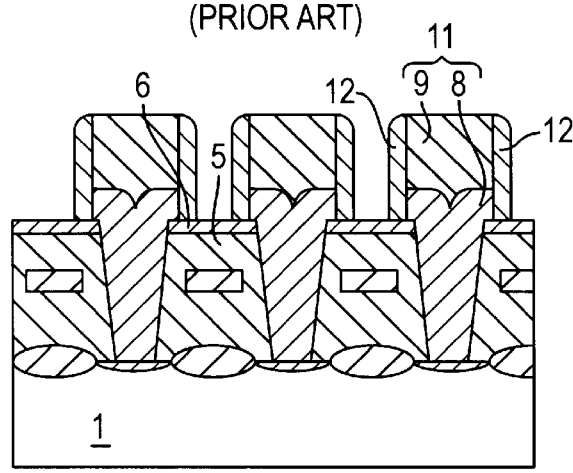
Figure 1F:
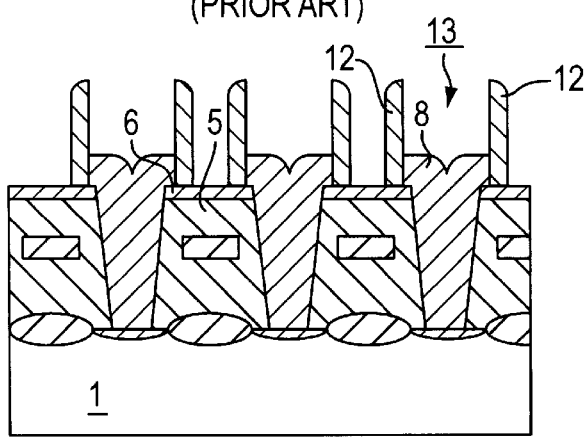
Figure 1G:
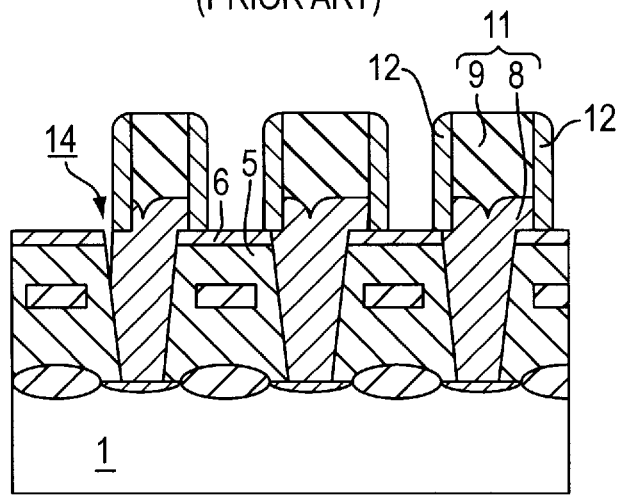
FIG. 1(g) and 1(h) are views illustrating problems in the aforementioned method for manufacturing the semiconductor device.
Figure 1H:
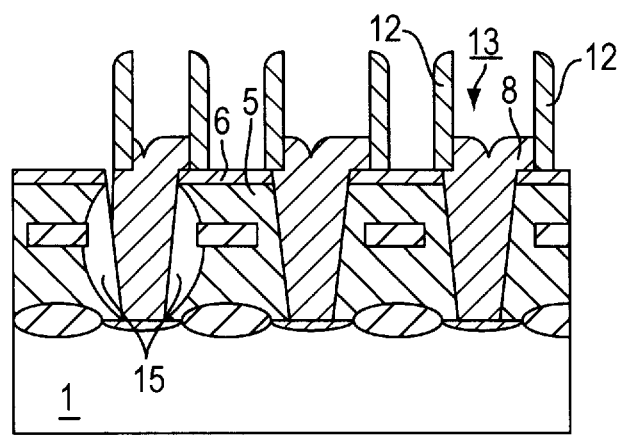
Figure 2A:
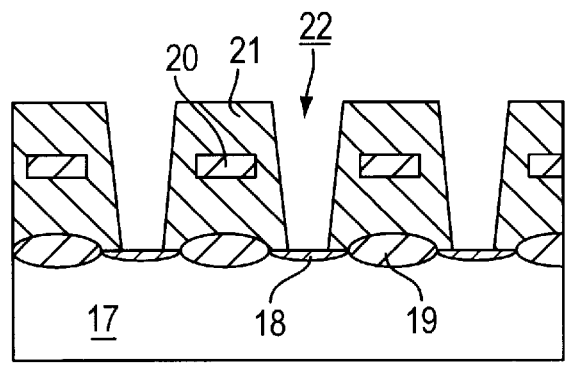
FIGS. 2(a) through 2(h) are process flow views showing a method for manufacturing the semiconductor device according to a first embodiment of the present invention in an order of steps.
Figure 2B:
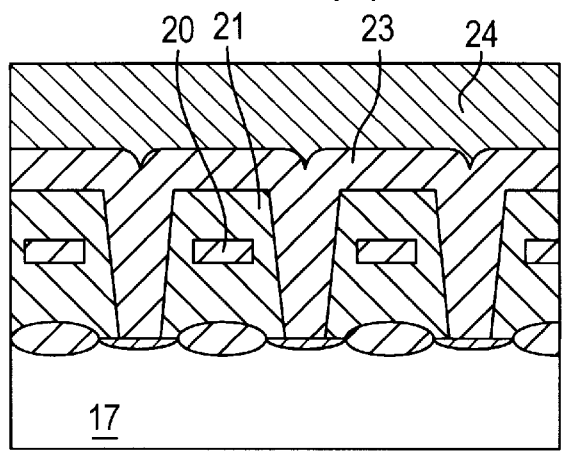

In the beginning, as shown in FIG. 2(a), after a diffusion layer region 18 (conductive layer), field oxide film 19, a bit line 20 and an interlayer insulating film 21 are formed on a silicon substrate 17 (semiconductor substrate), a contact hole 22 is opened which reaches the diffusion layer region 18. Then, as shown in FIG. 2(b), for example, a polysilicon film 23 (first conductive film) having a thickness of about 0.2 $\mu$m which constitutes a contact plug and a storage electrode and a BPSG film 24 (first insulating film) having a thickness of about 0.8 $\mu$m which constitutes a core of a cylinder are formed one after another on the overall surface of the silicon substrate. At this time, for example, phosphorous may be implanted to the polysilicon film 23 about $1 \times 10^{20}$ [atom/cm$^3$] as an impurity.

Figure 2C:
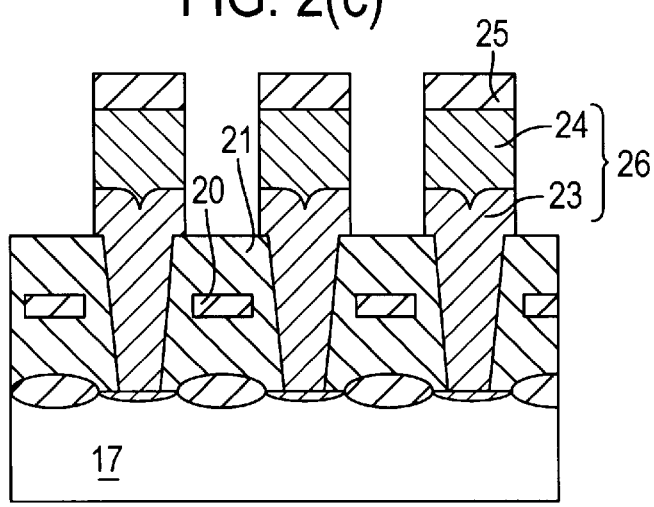
Figure 2D:
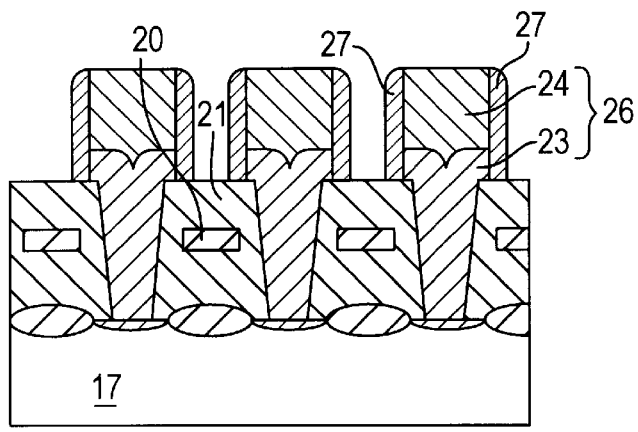

After that, as shown in FIG. 2(c), the photolithography technique will be used to pattern the BPSG film 24 and the polysilicon film 23 by using the stack resist pattern 25 as a mask, so that a stack pattern 26 is formed. Next, second conductive film is etched back, after the stack resist pattern 25 is removed and the polysilicon film (second conductive film) having a thickness of about 0.1 $\mu$m is formed on the overall surface of the silicon substrate. As a consequence, as shown in FIG. 2(d), the polysilicon film 27 is allowed to remain on a side wall of the stack pattern 26. At this time, phosphorous is implanted in the polysilicon film 27 about $1 \times 10^{20}$[atom/cm$^3$] as an impurity.

Figure 2E:
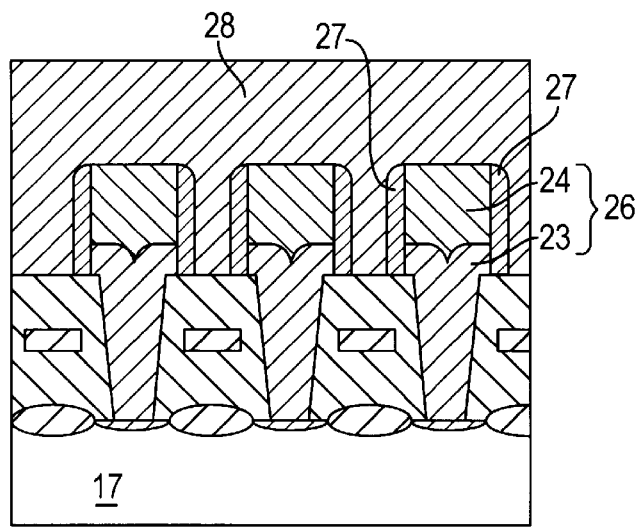
Figure 2F:
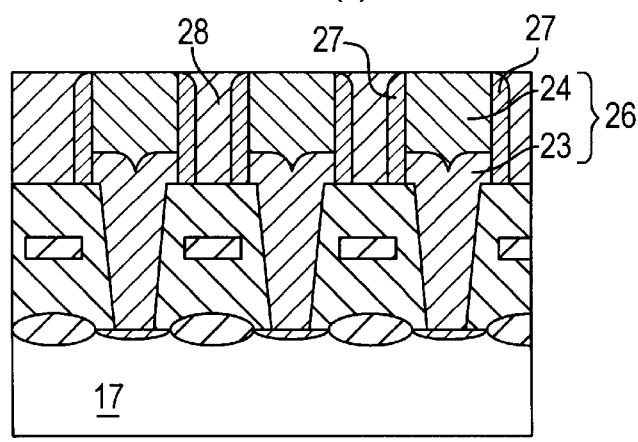

Next, as shown in FIG. 2(e), for example, the BPSG film 28 (second insulating film) having a thickness of about 0.8 $\mu$m is formed on the overall surface of the silicon substrate. Then, as shown in FIG. 2(f), the BPSG film 28 is etched to such an extent that the upper surface of the BPSG film 24 of the core and the uppermost part of the polysilicon film 27 on the side wall of the stack pattern 26 are exposed. At this time, though not shown in the drawings, only the inside of the memory cell area will be etched. A resist pattern is beforehand formed using the photolithography technique so that etching does not proceed outside of the memory cell area. In addition, the resist pattern is not formed, and the BPSG film 28 on the upper part may be removed by means of the CMP (Chemical Mechanical Polishing). As a consequence, the circumference of the stack pattern 26 is set in a state in which the circumference is filled with the BPSG film 28.

Figure 2G:
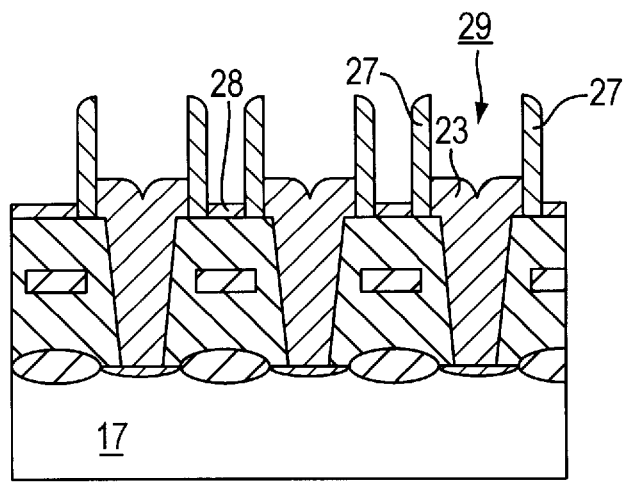

After that, as shown in FIG. 2(g), the overall surface of the silicon substrate is etched by using dilute hydrofluoric acid (DHF) to such extent that the BPSG film 24 of the core is removed and the upper surface of the polysilicon film 23 is completely exposed. As a consequence, the stack pattern 26 is formed into a cylindrical structure in which the core is removed thereby completing a storage electrode 29 having a large surface area. Then, a capacitor structure can be obtained by forming the dielectric film and a upper electrode one after another.

Figure 2H:
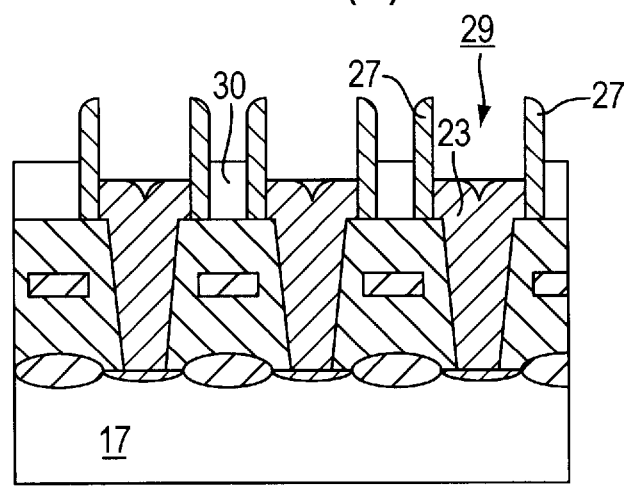

In addition, as a film for embedding the stack pattern 26 after the stack pattern 26 is formed, a silicon oxide film (second insulating film) may be used in place of the BPSG film 28. In such a case, since the silicon oxide film has a smaller etching rate with respect to dilute hydrofluoric acid (DHF) than the BPSG film, a thicker silicon oxide film 30 remains outside of the stack pattern 26 than the case of the BPSG film 28, as shown in FIG. 2(h). After that, the capacitor structure can be obtained by forming the dielectric film and the upper electrode one after another in a similar manner.

A second embodiment of the present invention will be explained hereinbelow by referring to FIGS. 3(a) through 3(h) and FIGS. 4(a) through 4(c). FIGS. 3(a) through 3(h) are process flow views showing a method for manufacturing a semiconductor device according to the second embodiment of the invention in an order of steps in the method. The manufacturing method according to the second embodiment is different from the method according to the first embodiment in that the part of the contact plug is separately formed out of the polysilicon which constitutes the storage electrode.

Figure 3A:
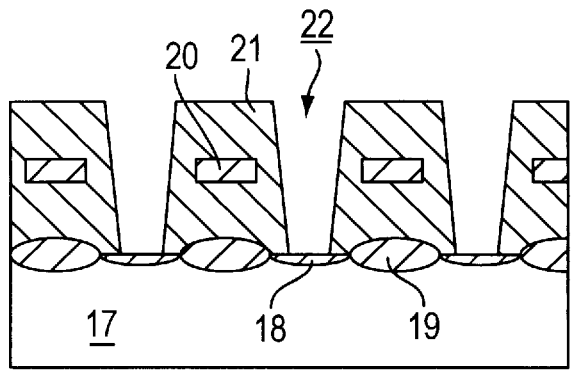
FIGS. 3(a) through 3(h) are process flow views showing a method for manufacturing the semiconductor device according to a second embodiment of the invention in an order of steps.
Figure 3B:
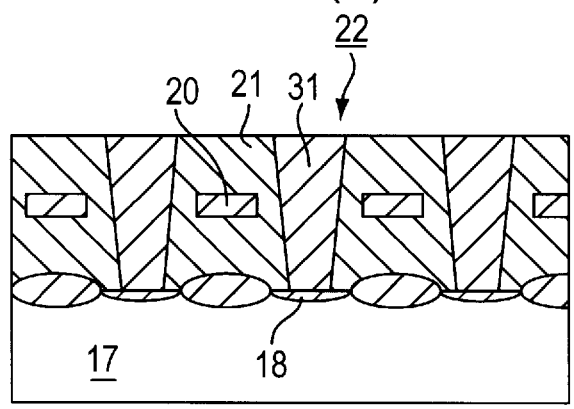

In the beginning, after the diffusion layer region 18, the field oxide film 19, the bit line 20 and the interlayer insulating film 21 are formed on the silicon substrate 17 as shown in FIG. 3(a), a contact hole 22 which reaches the diffusion layer region 18 is opened. Next, after the polysilicon film (first conductive film) having a thickness of about 0.2 μm is formed on the overall surface thereof, the polysilicon plug 31 is formed in such a manner that the polysilicon film remains only in the contact hole 22 as shown in FIG. 3(b) by etch back technique. Incidentally, the polysilicon plug 31 may be formed by using the selective polysilicon growth technique. In addition, for example, phosphorous may be implanted in this polysilicon plug 31 $1 \times 10^{20}$ [atom/cm$^3$] as an impurity.

Figure 3C:
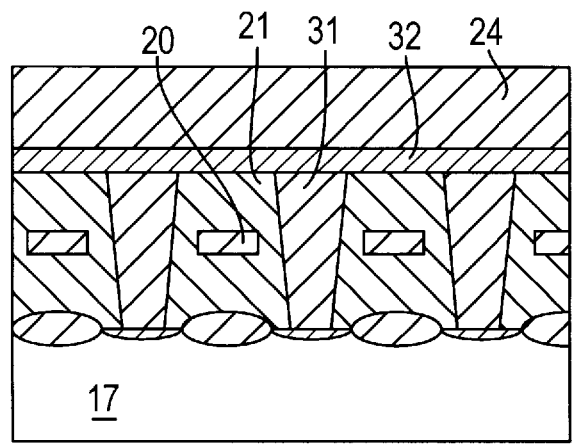
Figure 3D:
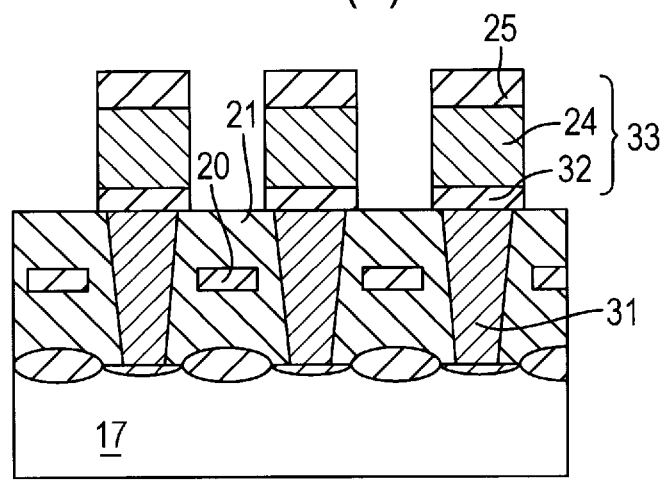
Figure 3E:
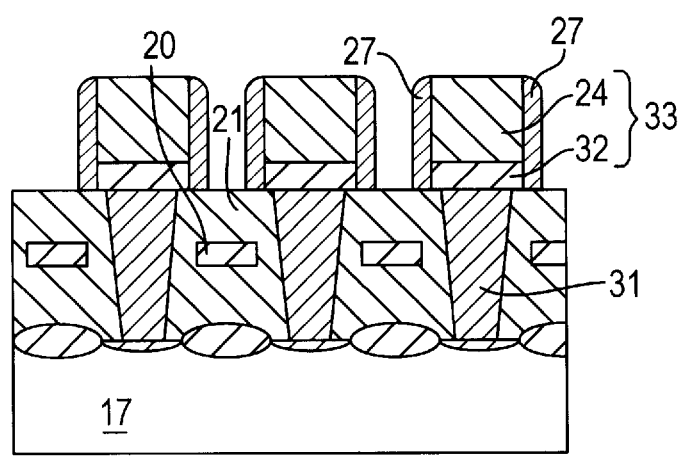

Next, as shown in FIG. 3(c), for example, a polysilicon film 32 (second conductive film) having a thickness of about 0.2 μm and a BPSG film 24 (first insulating film) having a thickness of about 0.8 μm are formed on the overall surface of the silicon substrate one after another. At this time, for example, phosphorous is implanted in the polysilicon film 32 about $1 \times 10^{20}$ [atom/cm$^3$] as an impurity. Then, as shown in FIG. 3(d), the stack pattern 33 is formed by patterning the polysilicon film 32 and the BPSG film 24, by using the stack resist pattern 25 as a mask, by using the photolithography technique. Next, after the stack resist pattern 25 is removed and the polysilicon film (third conductive film) having a thickness of about 0.1 μm is formed on the overall surface of the silicon substrate, the polysilicon film 27 remains only on the side wall of the stack pattern 33 use etch back technique as shown in FIG. 3(e). At this time, for example, phosphorous is implanted in the polysilicon film 27 to an extent of about $1 \times 10^{20}$ [atom/cm$^3$] as an impurity.

Figure 3F:
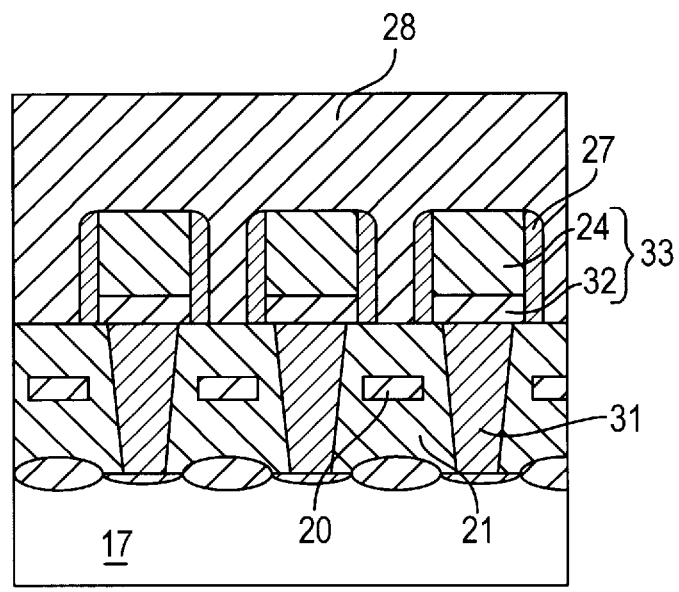
Figure 3G:
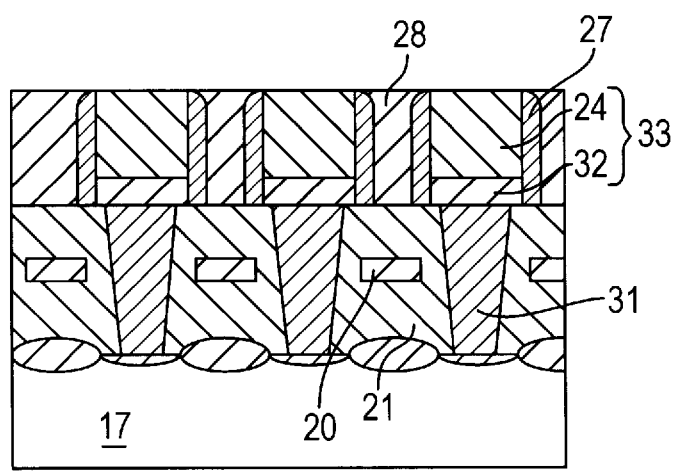

Next, as shown in FIG. 3(f), for example, the BPSG film 28 (second insulating film) having a thickness of about 0.8 μm is formed on the overall surface of the silicon substrate. Then, as shown in FIG. 3(g), the BPSG film 28 is etched to an extent that the uppermost part of the polysilicon film 27 on the upper surface of the BPSG film 24 of the core and on the side wall of the stack pattern 33 is exposed. At this time, though not shown in the drawings, only the inside of the memory cell area is etched. Then on the outside of the memory cell area, a resist pattern is formed by using the photolithography technique so that the etching of the substrate does not proceed. In addition, the resist pattern is not formed, and the BPSG film 28 on the upper part may be removed by means of the CMP. As a consequence, the circumference of the stack pattern 33 is set in a state in which the circumference is filling with the BPSG film 28.

Figure 3H:
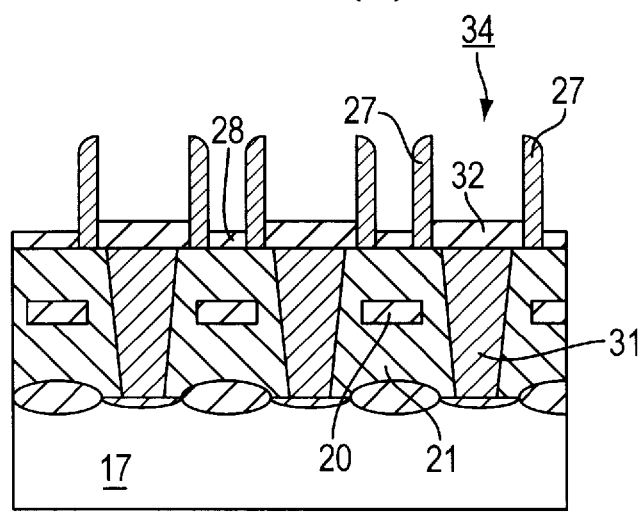
Figure 4A:
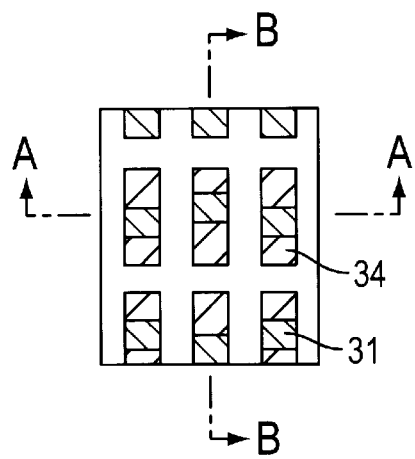
FIG. 4(a) is a plane view showing a state after the capacitance insulating film and the plate electrode of the semiconductor device according to the second embodiment are formed.
Figure 4B:
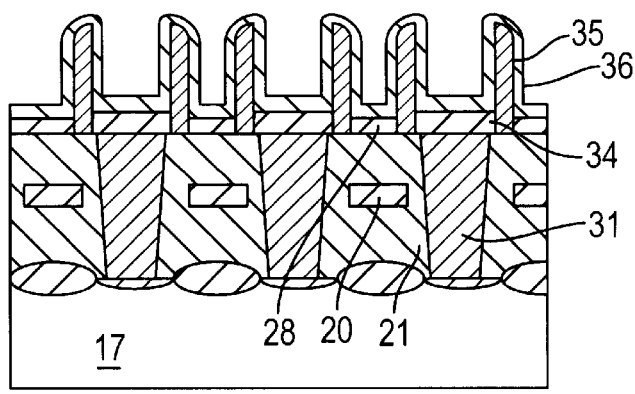
FIG. 4(b) is a sectional view taken along line B—B of FIG. 4(a), and FIG. 4 (c) is a sectional view taken along line C—C of FIG. 4 (a).
Figure 4C:
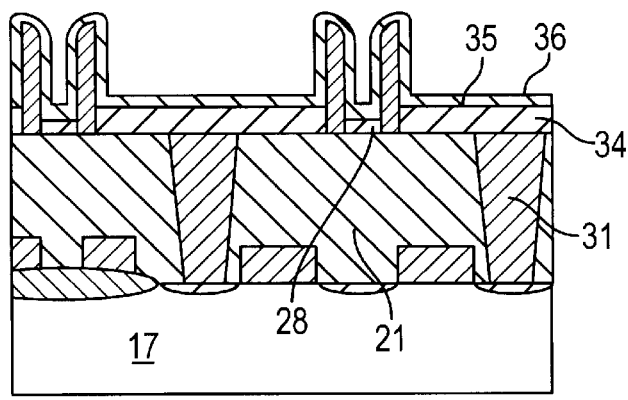

After that, as shown in FIG. 3(h), the overall surface of the silicon substrate is etched back by using, for example, dilute hydrofluoric acid to such an extent that the BPSG film 24 of the core is removed and the upper surface of the polysilicon film 32 is completely exposed. As a consequence, the stack pattern 33 is formed into a cylindrical structure where the core is removed thereby completing a storage electrode 34. Then, as shown in FIGS. 4(b) and 4(c), the capacitor structure can be obtained by forming the dielectric film 35 and the upper electrode 36 one after another.

Figure 5A:
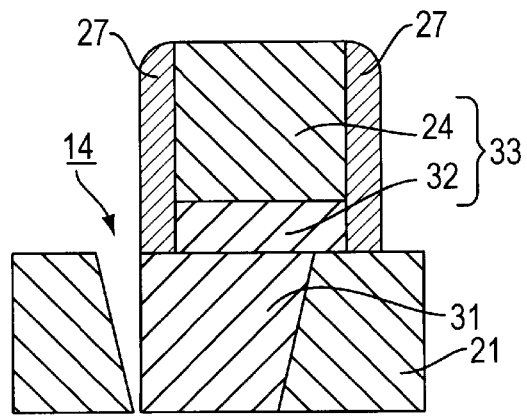
FIG. 5(a) through 5 (c) are views illustrating an advantage of the present invention.
Figure 5B:
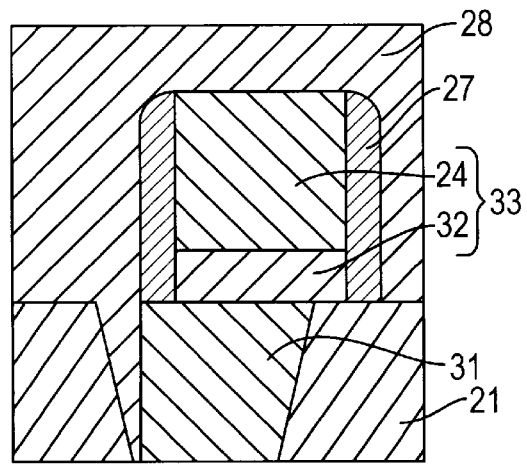
Figure 5C:
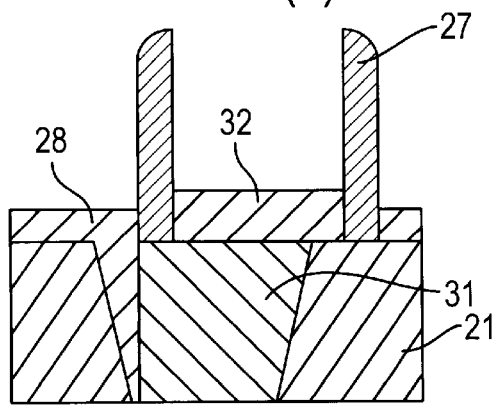

In the method for manufacturing the semiconductor device according to the aforementioned first and second embodiments, even in the cases that the stack resist pattern is largely collapsed with respect to the contact hole pattern in the photography process at the time of forming the stack, and that the stack resist pattern is small with the result that even when a slit 14 is formed in the interlayer insulating film 21 as shown in FIG. 5(a), the slit 14 is fulled with the BPSG film 28 as shown in FIG. 5(b). After that, even when the overall surface of the silicon substrate is etched for the removing of the core of the cylinder, the BPSG film 28 around the stack pattern is thicker than the BPSG film 24 of the core in this method for manufacturing the semiconductor device with the result that the BPSG film 28 still remains around the stack 33 when the BPSG film 24 of the core is completely removed, as shown in FIG. 5(c). Therefore, the part of the slit 14 of the interlayer insulating film 21 is never etched, thereby making it possible to solve the problem in the prior art, in which an etching liquid permeates the inside of the slit and generates a gap, so that the stack pattern is disappeared.

A third embodiment of the present invention will be explained hereinbelow by referring to FIGS. 6(a) through 6(g). FIGS. 6(a) through 6(g) are process flow views showing a method for manufacturing the semiconductor device according to the third embodiment of the invention in an order of steps in the method. The manufacturing method according to the third embodiment is different from the method according to the first and second embodiments, in that the silicon nitride film is formed on the interlayer insulating film and a cylindrical structure is formed with the silicon nitride film retained as a stopper film.

Figure 6A:
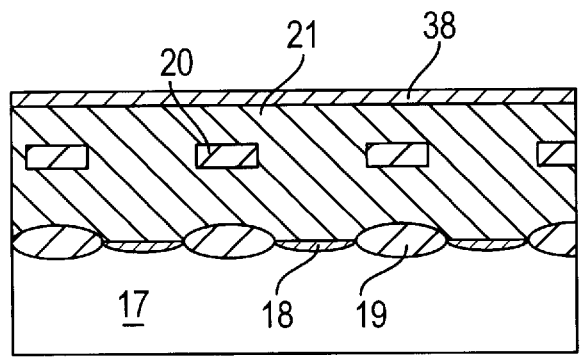
FIGS. 6(a) through 6(g) are process flow views showing a method for manufacturing a semiconductor device according to a third embodiment of the invention in an order of steps.
Figure 6B:
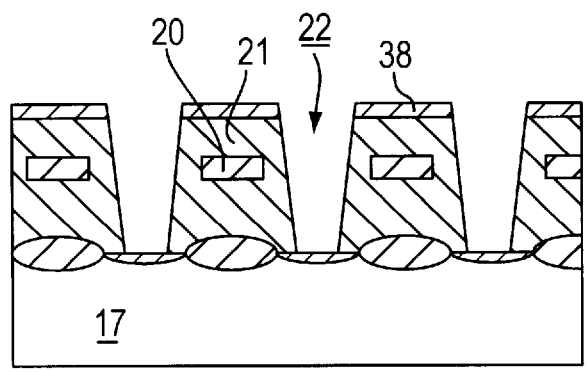
Figure 6C:
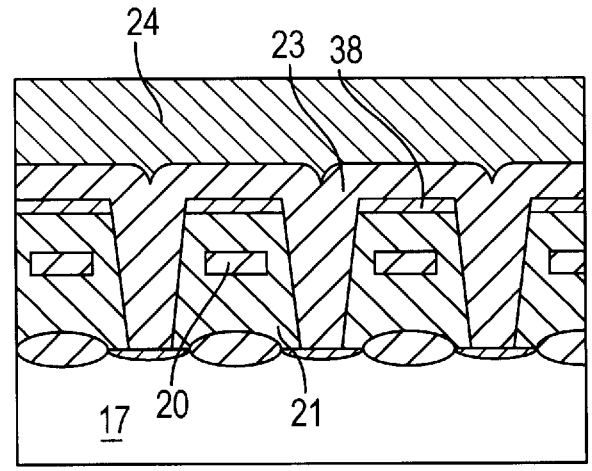

In the beginning, as shown in FIG. 6(a), the diffusion layer region 18, the field oxide film 19, the bit line 20 and the interlayer insulating film 21 are formed on the silicon substrate 17. Then, a silicon nitride film 38 (stopper insulating film) is further formed on the interlayer insulating film 21. Next, as shown in FIG. 6(b), the contact hole 22 which reaches the diffusion layer region 18 is opened. Then, as shown in FIG. 6(c), for example, a polysilicon film 23 having a thickness of about 0.2 μm which film constitutes a contact plug and a storage electrode and a BPSG film 24 having a thickness of about 0.8 μm which film constitutes the core of the cylinder are formed on the overall surface of the silicon substrate one after another. At this time, for example, phosphorous is implanted in the polysilicon film 23 about $1 \times 10^{20}$ [atom/cm$^3$] as an impurity.

Figure 6D:
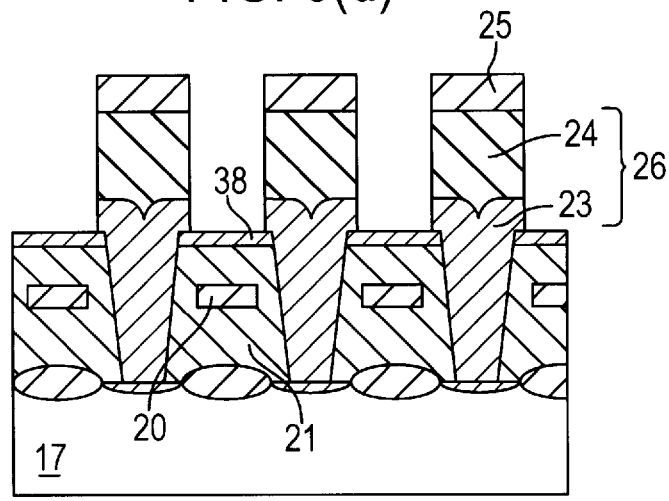
Figure 6E:
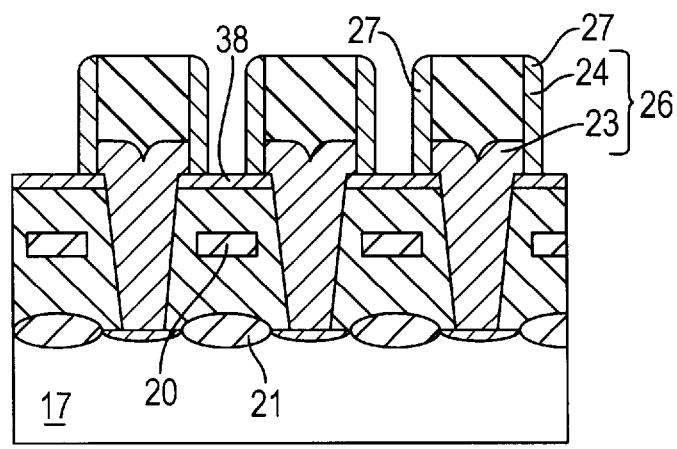

Then, as shown in FIG. 6(d), the stack pattern 26 is formed by patterning the polysilicon film 23 and the BPSG film 24 by using the stack resist pattern 25 as a mask by means of the photolithography technique. Next, after the stack resist pattern 25 is removed and the polysilicon film having a thickness of about 0.1 μm is formed on the overall surface of the silicon substrate, the silicon substrate is etched with the result that the polysilicon film 27 remains only on the side wall of the stack pattern 26, as shown in FIG. 6(e). At this time, for example phosphorous is implanted into the polysilicon film 27 $1 \times 10^{20}$[atom/cm$^3$] as an impurity.

Figure 6F:
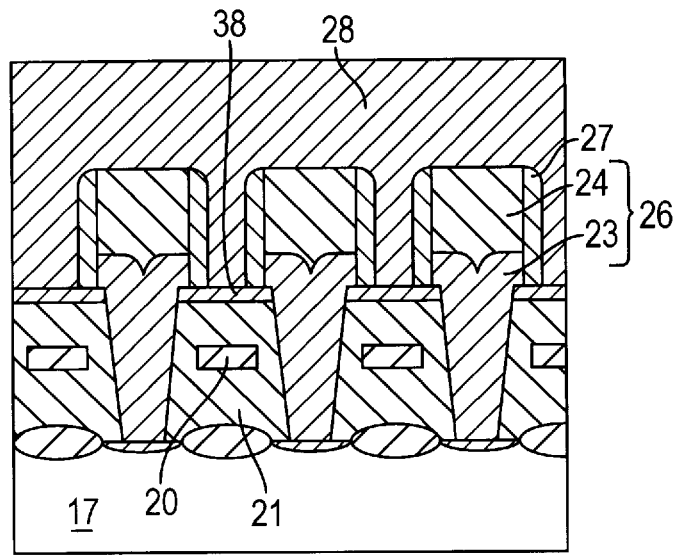
Figure 6G:
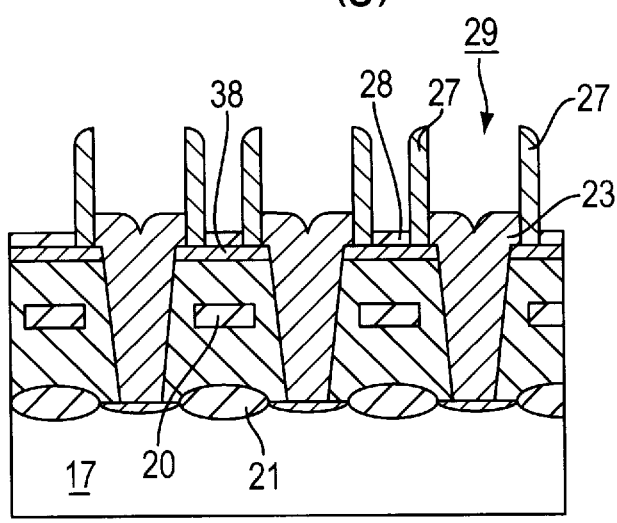

Next, as shown in FIG. 6(f), for example, a BPSG film 28 having a thickness of about 0.8 μm is formed on the overall surface of the silicon substrate. Then, as shown in FIG. 6(g), for example, the overall surface of the silicon substrate is etched by using DHF to such an extent that the BPSG film 24 of core is removed and the upper surface of the polysilicon film 23 is completely exposed. As a consequence, the stack pattern 26 is formed into a cylindrical structure wherein the core is removed, thereby completing a storage electrode 29. At this time, though not shown, the etching is stopped with the silicon nitride film 38 outside of the cell. Then, the capacitor structure can be obtained by forming the dielectric film and the upper electrode one after another.

Also, in the third embodiment, the same advantage can be obtained as the first and the second embodiments in that the disappearance of the stack pattern can be prevented even when the shift and becoming smaller of the stack resist pattern is formed. In addition in the case of the third embodiment, the silicon nitride film 38 on the interlayer insulating film 21 is used as an etching stopper film so that the etching of the interlayer insulating film 21 can be protected in an area except for the cell part at the time of the etch-back.

As described above in detail, even when a shift in the setting is generated between the contact hole pattern, the first insulating film, and the first conductive film pattern in the process of photolithography, and a slit is formed in the interlayer insulating film as a result of the reduction of the pattern of the first insulating film and the first conductive film, the slit is filled with the second insulating film. At the same time, since the second insulating film is thicker than the first insulating film which constitutes the core of the cylinder, the first insulating film is removed, and the interlayer insulating film is not exposed at the time of the removal of the core of the cylinder and the interlayer insulating film is never etched. Consequently, the prior problem of the disappearance of the stack when the process is performed and thereby causing to cease functioning the part as a capacitor, is solved thereby improving the yield of the semiconductor device.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method for manufacturing a semiconductor device having a stacked capacitor on an interlayer insulating film and having a cylindrically structured storage electrode, the method comprising the steps of:

a) forming an interlayer insulating film on a semiconductor substrate having a conductive layer followed by opening on the interlayer insulating film a contact hole which reaches the conductive layer;

b) forming a first conductive film on an overall surface of the semiconductor substrate, the surface extending over said interlayer insulating film and an inside of said contact hole;

c) forming a first insulating film on the overall surface of the substrate;

d) patterning the first insulating film and the first conductive film so that the first insulating film and the first conductive film are allowed to remain on a storage electrode formation area;

e) forming a second conductive film which constitutes an external circumference part of the storage electrode on a side wall of said first insulating film and said first conductive film which have been patterned;

f) forming a second insulating film on the overall surface of the semiconductor substrate, so that the upper surface of the second insulating film is set higher than the upper surface of said first insulating film;

g) removing said second insulating film until the upper surface of said first insulating film is exposed; and h) etching back said first insulating film and said second insulating film under a high selectivity etching condition until said first insulating film is removed, and so that the top of said second insulating film is at a level lower than the top of said second conductive film.

2. A method for manufacturing a semiconductor device having a stacked capacitor on an interlayer insulating film and having a cylindrically structured storage electrode, the method comprising the steps of:

a) forming an interlayer insulating film on a semiconductor substrate having a conductive layer followed by opening on said interlayer insulating film a contact hole which reaches said conductive layer;

b') selectively forming a first conductive film in said contact hole;

b") forming a second conductive film which constitutes a storage electrode on an overall surface of the semiconductor substrate;

c) forming a first insulating film on the overall surface of the substrate;

d') patterning the first insulating film and the second conductive film so that the first insulating film and the second conductive film are allowed to remain on a storage electrode formation area;

e') forming a third conductive films which constitutes an external circumference part of the storage electrode, on a side wall of said first insulating film and said second conductive film which have been patterned;

f) forming a second insulating film on the overall surface of the semiconductor substrate so that the upper surface of said second insulating film is located at a position higher than the upper surface of said first insulating film;

g) removing said second insulating film until the upper surface of said first insulating film is exposed; and h) etching back said first insulating film and said second insulating film under a high selective etching condition until said first insulating film is removed.

3. A method for manufacturing a semiconductor device having a stacked capacitor on an interlayer insulating film and having a cylindrically structured storage electrode, the method comprising the steps of:

a') forming an interlayer insulating film on a semiconductor device having a conductive layer followed by forming a stopper insulating film on said interlayer insulating film;

a") opening on said stopper insulating film and said interlayer insulating film a contact hole which reaches said conductive layer;

b") forming a first conductive films which constitutes a storage electrodes on the overall surface of the semiconductor substrate, the surface extending over said stopper insulating film and the inside of said contact hole;

c) forming a first insulating film on an overall surface of the substrate;

d) patterning the first insulating film and the first conductive film so that the first insulating film and the first conductive film are allowed to remain on a storage electrode formation area;

e) forming a second conductive film, which constitutes an external circumference part of the storage electrode, on a side wall of said first insulating film and said first conductive film which have been patterned;

f) forming a second insulating film on the overall surface of the semiconductor surface, so that the upper surface of said second insulating film is located at a position higher than the upper surface of said first insulating film;

g) removing said second insulating film until the upper surface of said first insulating film is exposed; and h) etching back said first insulating film and said second insulating film under a high selectivity etching condition until said first insulating film is removed, and so that the ton of said second insulating film is at a level lower than the ton of said second conductive film.

4. A method for manufacturing a semiconductor device according to any of claims 1 through 3, wherein the etching back, at said etching back step, is done under a condition that the etching rate of said first insulating film is equal to that of said second insulating film.

5. A method for manufacturing a semiconductor device according to claim 4, wherein the second insulating film is removed by etching or chemical mechanical polishing at the step of removing said second insulating film until the upper surface of said first insulating film is exposed.

6. A method for manufacturing a semiconductor device according to claim 5, wherein only the second insulating film above the circumference and just above the storage electrode is selectively removed at the step of removing the second insulating film until the upper surface of said first insulating film is exposed.

7. A method for manufacturing a semiconductor device according to claim 4, wherein only the second insulating film above the circumference and just above the storage electrode is selectively removed at the step of removing the second insulating film until the upper surface of said first insulating film is exposed.

8. A method for manufacturing a semiconductor device according to claim 4, wherein said etching back step is performed so that the top of said second insulating film is lower than the top of said first conductive film.

9. A method for manufacturing a semiconductor device according to any of claims 1 through 3, wherein the second insulating film is removed by etching or chemical mechanical polishing at the step of removing said second insulating film until the upper surface of said first insulating film is exposed.

10. A method for manufacturing a semiconductor device according to any of claims 1 through 3, wherein only the second insulating film above the circumference of the storage electrode is selectively removed at the step of removing the second insulating film until the upper surface of said first insulating film is exposed.

11. A method for manufacturing a semiconductor device according to any of claims 1 through 3, wherein the etching back, at said etching back step, is done under a condition that the etching rate of said first insulating film is larger than that of said second insulating film.

12. A method for manufacturing a semiconductor device according to claim 11, wherein the second insulating film is removed by etching or chemical mechanical polishing at the step of removing said second insulating film until the upper surface of said first insulating film is exposed.

13. A method for manufacturing a semiconductor device according to claim 12, wherein only the second insulating film above the circumference and just above the storage electrode is selectively removed at the step of removing the second insulating film until the upper surface of said first insulating film is exposed.

14. A method for manufacturing a semiconductor device according to claim 11, wherein only the second insulating film above the circumference and just above the storage electrode is selectively removed at the step of removing the second insulating film until the upper surface of said first insulating film is exposed.

15. A method for manufacturing a semiconductor device according to claim 11, wherein said etching back step is performed so that the top of said second insulating film remains higher than the top of said first conductive film.

16. A method for manufacturing a semiconductor device according to any of claims 1 through 3, further comprising a step, after said etching back step, of forming a capacitor dielectric layer on a remaining portion of said second insulating film.

* * * * *